(12) United States Patent
Sugg

(10) Patent No.: US 7,402,937 B2
(45) Date of Patent: Jul. 22, 2008

(54) PIEZOELECTRIC ACTUATOR

(75) Inventor: Bertram Sugg, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 121 days.

(21) Appl. No.: 10/578,902

(22) PCT Filed: Sep. 7, 2004

(86) PCT No.: PCT/DE2004/001980

§ 371 (c)(1),
(2), (4) Date: May 12, 2006

(87) PCT Pub. No.: WO2005/053046

PCT Pub. Date: Jun. 9, 2005

(65) Prior Publication Data

US 2007/0046148 A1    Mar. 1, 2007

(30) Foreign Application Priority Data

Nov. 14, 2003   (DE)   ................. 103 53 171

(51) Int. Cl.
   *H01L 41/08*  (2006.01)
(52) U.S. Cl. ........................ 310/358; 310/328
(58) Field of Classification Search .......... 310/328, 310/366
   See application file for complete search history.

(56) References Cited

U.S. PATENT DOCUMENTS

| | | | | |
|---|---|---|---|---|
| 5,126,618 A | * | 6/1992 | Takahashi et al. | 310/346 |
| 5,266,862 A | * | 11/1993 | Ohya | 310/328 |
| 5,300,852 A | * | 4/1994 | Isogai et al. | 310/358 |
| 5,329,496 A | | 7/1994 | Smith | |
| 5,438,232 A | * | 8/1995 | Inoue et al. | 310/328 |
| 5,548,564 A | | 8/1996 | Smith | |
| 5,744,898 A | | 4/1998 | Smith et al. | |
| 5,828,160 A | * | 10/1998 | Sugishita | 310/366 |
| 6,054,793 A | * | 4/2000 | Kawai et al. | 310/312 |
| 6,411,012 B2 | * | 6/2002 | Furukawa et al. | 310/328 |
| 6,912,761 B2 | * | 7/2005 | Yasugi et al. | 29/25.35 |
| 7,042,143 B2 | * | 5/2006 | Bindig et al. | 310/366 |
| 7,276,841 B2 | * | 10/2007 | Takaoka et al. | 310/363 |
| 7,288,875 B2 | * | 10/2007 | Kadotani et al. | 310/328 |
| 2003/0168624 A1 | * | 9/2003 | Hammer et al. | 252/62.9 PZ |

FOREIGN PATENT DOCUMENTS

| | | |
|---|---|---|
| DE | 42 01 937 A1 | 7/1992 |
| DE | 101 01 188 A1 | 8/2002 |
| EP | 0 907 245 A2 | 4/1999 |

* cited by examiner

*Primary Examiner*—Mark Budd
(74) *Attorney, Agent, or Firm*—Ronald E. Greigg

(57) ABSTRACT

A piezoelectric actuator, for example for actuating a mechanical component, has a multilayered structure of piezoelectric layers and, in a piezoelectrically active region, can be acted on with an electrical voltage by means of internal electrodes that are situated between the layers. The layer structure of the piezoelectric actuator includes inactive regions; at least the top part or bottom part, as an inactive region without internal electrodes, is comprised of a material whose dielectric constant is less than the dielectric constant of the active region.

11 Claims, 2 Drawing Sheets

US 7,402,937 B2

PIEZOELECTRIC ACTUATOR

CROSS-REFERENCE TO RELATED APPLICATIONS

This application is a 35 USC 371 application of PCT/DE 2004/001980 filed on Sep. 7, 2004.

BACKGROUND OF THE INVENTION

1. Field of the Invention

The invention relates to an improved piezoelectric actuator, for example for actuating a mechanical component such as a switching valve in a fuel injector system.

2. Description of the Prior Art

DE 199 28 189 A1 has disclosed that using the so-called piezoelectric effect, a piezoelectric element for controlling the needle stroke of a valve or the like can be composed of a material with a suitable crystalline structure. The application of an external electrical voltage causes a mechanical reaction of the piezoelectric element, which, depending on the crystalline structure and the regions to which the electrical voltage is applied, produces a compression or traction in a predeterminable direction.

Due to the extremely rapid and precisely controllable stroke effect, such piezoelectric actuators can be used in producing control elements, for example for actuating switching valves in fuel injection systems of motor vehicles. In these actuators, the voltage-controlled or charge-controlled deflection of the piezoelectric actuator is used to position a control valve, which in turn regulates the stroke of a nozzle needle.

Since the electrical field intensities required for actuating the piezoelectric actuator lie in a range of several kV/mm and it is generally desirable to use moderate electrical voltages for triggering purposes, the piezoelectric actuator here is comprised of a plurality of layers of stacked metallized piezoelectric ceramics to produce a so-called multilayered actuator. To accomplish this, internal electrodes that are deposited, for example, by means of a printing process are provided between the layers and external electrodes are provided to supply an electric voltage. A typical method for manufacturing such layers is the sheet casting technique. The individual layers are metallized in order to manufacture the internal electrodes and stacked on top of one another, the piezoelectric effect then exerting its action between two layers with internal electrodes of different polarities.

The top and bottom region, however, usually do not have internal electrodes since on the one hand, a certain amount of insulation space toward the end surfaces is required in order to prevent short circuits in relation to the outside and on the other hand, passive zones are used for electrical connection to the external electrodes. Passive regions can also be provided in the middle of the piezoelectric actuator. But the problem with this, however, is that these passive layers, in the form of covering packets, represent parasitic or interfering capacitances in relation to the electrical ground, which can generate electromagnetic radiation in motor vehicles or other applications.

DE 100 25 998 A1 has clearly disclosed the fact that passive regions of changeable length are provided at both ends of the layer structure. In this known piezoelectric actuator, on the one hand, the passive layers are comprised of the same ceramic material as the active region, but with external electrodes that contact only one side or do not contact them at all so that the inactive regions also have the internal electrode/metal layers passing through them. On the other hand, the respective inactive region can also be a whole electrically insulated metal or ceramic block that can simply be glued for example to the piezoelectrically active region.

SUMMARY AND ADVANTAGES OF THE INVENTION

The piezoelectric actuator described above is, as previously mentioned, comprised of a multilayered structure of piezoelectric layers and internal electrodes situated between the layers in a piezoelectrically active region and, in order to be triggered with an electrical voltage, is provided with a contacting of the internal electrodes that alternates from layer to layer. The layer structure of the piezoelectric actuator also includes at least one inactive region, e.g. a bottom part and/or top part in the form of a covering packet, at one end or within the active region in terms of its overall installation length.

In the piezoelectric actuator according to the present invention, the dielectric constant of at least the top part or bottom part, as inactive regions, is advantageously lower than the dielectric constant of the active region. Preferably, the inactive regions and the active region are manufactured of the same ceramic base substance; additional doping agents are added to the inactive regions so that they have a minimal dielectric constant. For example, the base substance is lead zirconate titanate (PZT) and the doping agent is silver.

In an advantageous embodiment form, the layer thicknesses of the inactive regions are the same in the top part and bottom part. According to another embodiment form, the inactive regions are comprised of an electrically polarized ceramic with an electrical field applied to it in order to minimize the dielectric constant.

The advantage of the present invention is that first, the active region of the piezoelectric actuator with a predetermined piezoelectric ceramic remains unaffected, i.e. the characteristic quantities such as idle stroke, blocking force, etc. of the active actuator element remain unchanged. The material selection according to the invention, the geometry, or the polarity state of the covering packets in the top part and/or bottom part then makes it possible to minimize the parasitic capacitance $C_{para}$ in the top part and/or bottom part.

BRIEF DESCRIPTION OF THE DRAWINGS

An exemplary embodiment of the piezoelectric actuator according to the invention will be explained in detail herein below, in conjunction with the drawings, in which.

DESCRIPTION OF THE PREFERRED EMBODIMENTS

Figure 1:
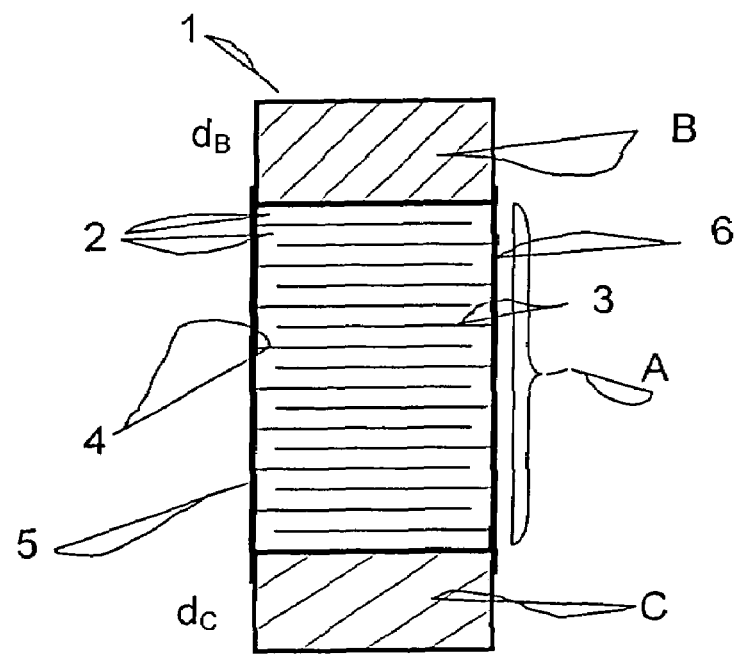
FIG. 1 shows a section through a piezoelectric actuator, having a multilayered structure composed of piezoelectric ceramic layers and having active and inactive regions.

FIG. 1 shows a piezoelectric actuator 1 that is constructed in an intrinsically known manner of piezoelectric layers 2 of a ceramic material, e.g. so-called green sheets, with a suitable crystalline structure so that by using the so-called piezoelectric effect, when an external electric DC voltage is applied to internal electrodes 3 and 4 via externally contacted electrodes 5 and 6, a mechanical reaction of the piezoelectric actuator 1 is produced.

The piezoelectric actuator 1 is subdivided into a piezoelectrically active region A and two passive regions B and C in the form of covering packets at the top and bottom ends. In this context, a region is referred to as active when it has internal electrodes 3 and 4 of alternating polarities passing through it and therefore contributes to the overall length expansion of the piezoelectric actuator 1 desired for the operation.

In the exemplary embodiment according to the invention, the multilayered piezoelectric actuator 1 is constructed so that the material compositions of the ceramic layers in the active region A and in the passive regions B and C differ from one another. It is consequently necessary to use two types of ceramic to manufacture the green sheets. For example, these can be based on various types of ceramic, e.g. based on lead zirconate titanate (PZT). This ceramic or other ceramics based on a shared basic substance can be correspondingly changed and adapted by adding suitable doping agents, e.g. silver.

The ceramic in the active region A has a dielectric constant of $\epsilon_{33}$. The dielectric constant $\epsilon'_{33}$ of the region B or C is selected in accordance with the relationship $\epsilon'_{33} < \epsilon_{33}$. The ceramic in regions B and C according to FIG. 1 is then selected or modified so that in any case, the dielectric constant $\epsilon'_{33}$ is minimized.

The parasitic capacitances $C_B$ and $C_C$ of the regions B or C, as a function of the layer thicknesses $d_B$ and $d_C$, thus work out to:

$$C_{B,C} = \epsilon_0 * \epsilon'_{33} * A / d_{B,C}, \text{ where } \epsilon_0 = 8.85 * 10^{-12} * AS/Vm \quad (1),$$

where A is the active area.

The exemplary embodiment according to the invention includes the possibility of the internal electrode layer 3 or 4 last bonded in place toward the top part B and bottom part C being selected to have the same or different polarities.

Figure 2:
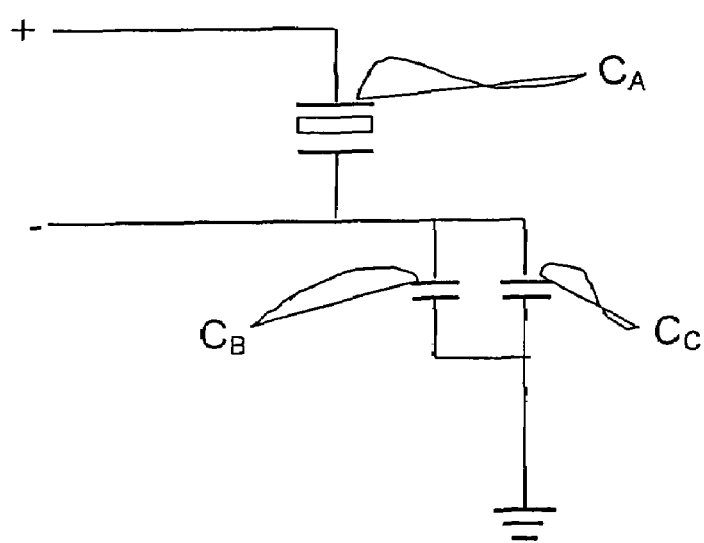
FIG. 2 shows a schematic wiring diagram of the capacitances occurring in the piezoelectric actuator when the inactive regions are connected to internal electrodes of the active region with the same polarity.
Figure 3:
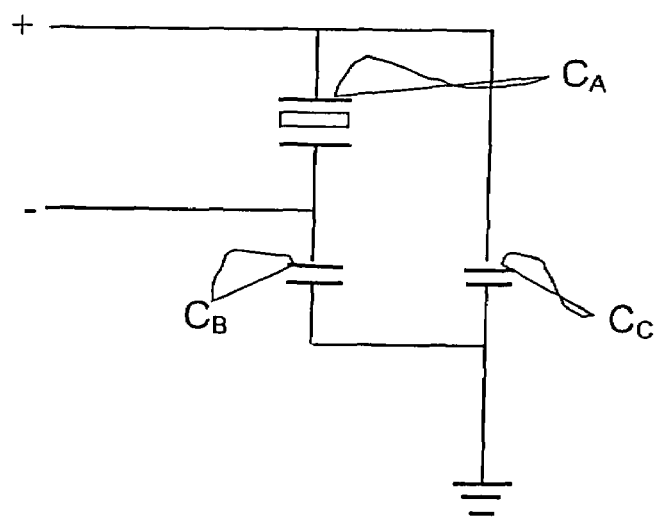
FIG. 3 shows a schematic wiring diagram of the capacitances occurring in the piezoelectric actuator when the inactive regions are connected to internal electrodes of the active region with different polarities.

The first case yields the schematic wiring diagram according to FIG. 2 and the second case yields the schematic wiring diagram according to FIG. 3; one of the two variants can be more advantageous depending on the electrical modulation of the structure of the piezoelectric actuator 1.

Figure 4:
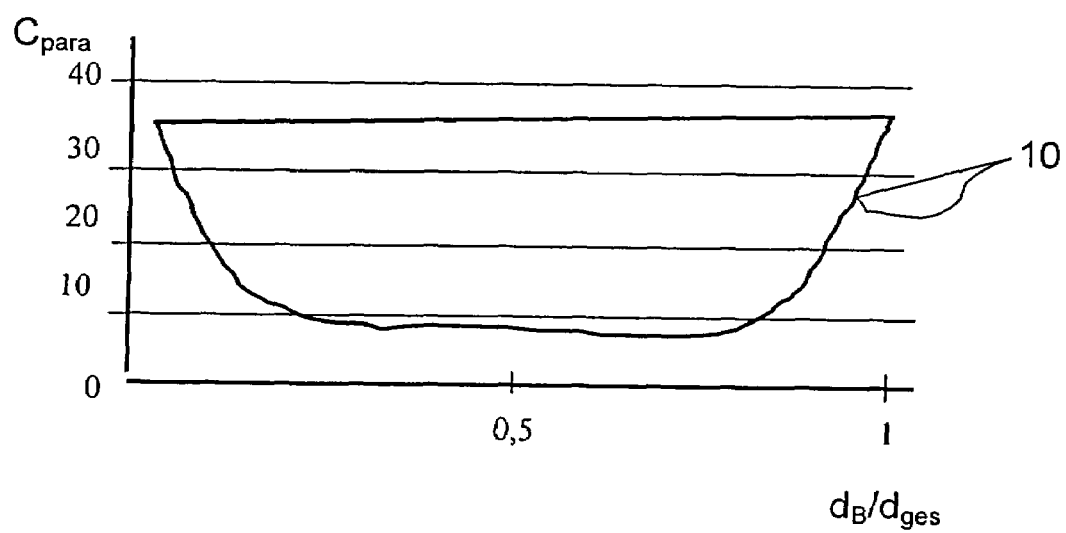
FIG. 4 shows a curve of the parasitic capacitances with certain proportions of the layer thicknesses of the inactive regions.

When the internal electrodes 3 or 4 are bonded in accordance with FIG. 2, there is yet another optimization possibility for minimizing the parasitic capacitances $C_B$ and $C_C$. Since as a rule the piezoelectric actuators 1 have a fixed overall length, a certain length $d_B + d_C = d_{ges}$ is available for the respective passive region B or C. This yields the curve 10 shown in FIG. 4, which depicts the parasitic capacitances $C_B$ and $C_C$ as $C_{para}$. Particularly if $d_B = d_C = d_{ges}/2$ is chosen, then this yields a minimum for $C_{para} = C_B + C_C$.

The invention disclosed here consequently expressly includes a piezoelectric actuator 1 with symmetrical covering packets B and C on the top part and bottom part. In particular, the minimization achieved by this geometric effect functions even if the covering packets B and C are comprised of the same ceramic material as the active region A.

Another aspect not shown in the drawings relates to the adaptation of the parasitic capacitance $C_{para}$ by means of an at least partial polarization of the covering packets B and C. If one wishes to set a particular capacitance value $C_{para}$ in the covering packets B and C for a particular electrical modulation, then this can be achieved by adapting the dielectric constant $\epsilon'_{33}$ and in particular by means of the polarization state of the covering packets B and C. Since unpolarized ceramic has a dielectric constant only half as great as that of polarized ceramic, the parasitic capacitance $C_{para}$ can be quasi-tuned by applying an appropriate electrical field.

The foregoing relates to a preferred exemplary embodiment of the invention, it being understood that other variants and embodiments thereof are possible within the spirit and scope of the invention, the latter being defined by the appended claims.

The invention claimed is:

1. In a piezoelectric actuator, comprising
   a multilayered structure of piezoelectric layers, having a piezoelectrically active region, with internal electrodes that are situated between the layers and can be acted on with an electrical voltage, and having
   inactive regions without internal electrodes in the top part and bottom part of the piezoelectric actuator, the improvement wherein
   the dielectric constant of at least the top part or bottom part, as an inactive region, is less than the dielectric constant of the active region,
   wherein the inactive regions and the active region are manufactured out of the same ceramic base substance and an additional doping agent is added to the inactive regions to minimize the dielectric constant.

2. The piezoelectric actuator according to claim 1, wherein the base substance is lead zirconate titanate and the doping agent is silver.

3. The piezoelectric actuator according to claim 1, wherein the layer thicknesses of the inactive regions are the same.

4. The piezoelectric actuator according to claim 1, wherein the layer thicknesses of the inactive regions are the same.

5. The piezoelectric actuator according to claim 2, wherein the layer thicknesses of the inactive regions are the same.

6. The piezoelectric actuator according to claim 1, wherein the inactive regions are composed of an electrically polarized ceramic with an electrical field applied to it so as to minimize the dielectric constant.

7. The piezoelectric actuator according to claim 1, wherein the inactive regions are composed of an electrically polarized ceramic with an electrical field applied to it so as to minimize the dielectric constant.

8. The piezoelectric actuator according to claim 2, wherein the inactive regions are composed of an electrically polarized ceramic with an electrical field applied to it so as to minimize the dielectric constant.

9. The piezoelectric actuator according to claim 3, wherein the inactive regions are composed of an electrically polarized ceramic with an electrical field applied to it so as to minimize the dielectric constant.

10. The piezoelectric actuator according to claim 4, wherein the inactive regions are composed of an electrically polarized ceramic with an electrical field applied to it so as to minimize the dielectric constant.

11. The piezoelectric actuator according to claim 5, wherein the inactive regions are composed of an electrically polarized ceramic with an electrical field applied to it so as to minimize the dielectric constant.

* * * * *